United States Patent [19]

Banura et al.

[11] Patent Number: 4,634,962

[45] Date of Patent: Jan. 6, 1987

[54] PHASE NOISE ANALYZER

[75] Inventors: George A. Banura; Richard L. Noland, both of Ridgecrest, Calif.

[73] Assignee: The United States of America as represented by the Secretary of the Navy, Washington, D.C.

[21] Appl. No.: 708,459

[22] Filed: Mar. 5, 1985

[51] Int. Cl.$^4$ .................. G01R 23/16; G01R 27/00
[52] U.S. Cl. ................. 324/57 N; 324/77 C; 324/57 SS
[58] Field of Search .......... 329/145, 50; 455/202, 455/324; 324/57 N, 57 SS, 77 H, 83 Q, 84, 77 T

[56] References Cited

U.S. PATENT DOCUMENTS

| | | | |
|---|---|---|---|
| 2,933,683 | 4/1960 | Clark, Jr. | 324/83 |
| 2,977,538 | 3/1961 | Secretan | 324/83 |
| 3,392,337 | 7/1968 | Neuburger | 329/145 |
| 3,711,773 | 1/1973 | Hekimian et al. | 324/83 R |
| 3,737,766 | 6/1973 | Lubarsky, Jr. | 324/57 R |
| 3,916,307 | 10/1975 | Hekimian | 324/83 R |
| 4,002,969 | 1/1977 | Barley | 324/57 N |

FOREIGN PATENT DOCUMENTS 1092433  5/1984  U.S.S.R. ................ 324/57 N

OTHER PUBLICATIONS

Hewlett-Packard: 1970 catalog—Section on Audio Analyzers and Selective Voltmeters (pp. 455+).
Reynolds: "Measure Phase Noise"—Electronic Design—Feb. 77, pp. 106-108.

*Primary Examiner*—Reinhard J. Eisenzopf
*Assistant Examiner*—Jose M. Solis
*Attorney, Agent, or Firm*—R. F. Beers; W. Thom Skeer

[57] ABSTRACT

A phase noise analyzer uses a microwave section to produce a standard reference voltage which is filtered by a sequenced pair of frequency agile filters. The filter output is fed to an indicator which is calibrated to the desired units.

7 Claims, 8 Drawing Figures

PHASE NOISE ANALYZER

BACKGROUND OF THE INVENTION

1. Field of the Invention

This invention pertains to the field of electricity. More particularly, this invention pertains to measuring and testing of electrical parameters. In still greater particularity, the invention is directed to the measurement of electrical energy per se. By way of further characterization the invention the invention will be described as it pertains to a phase noise analyzer.

2. Description of the Prior Art

In the field of electronic design and engineering it is oftentimes necessary to determine the purity of a microwave signal source. The variation in amplitude, frequency, and phase of such a signal is affected by circuit design and performance. Each variation is measurable and each has instrumentation techniques to provide the circuit designer or evaluator a quantitative indication of the degree of presence of the variation. Some types of signal variation or distortion are more easily detected than others.

A particularly troublesome signal parameter to instrument is the presence or degree of presence of phase noise. This type of distortion is characterized by the presence of discrete frequency bands displaced from the frequency of the signal of interest. When present, these spurious frequency bands are measured relative to the amplitude and frequency of the desired signal. The percentage of the spurious signal being a figure of merit for the circuit design.

Past measurement efforts have involved isolation of the spurious signal, measurement of the amplitude of that isolated signal, measurement of the amplitude of the desired signal, and calculation of the value. Prior to making this invention, the inventors were unaware of any instrument able to perform this measurement directly. Although a variety of noise analyzers and jitter measuring devices were known none was available to measure this design parameter in a quick and simple fashion.

SUMMARY OF THE INVENTION

This invention provides direct measurement of phase noise. The circuit of the invention accepts the microwave signal to be tested. The accepted signal is adjusted to a datum value by a feedback controlled attenuation circuit. The output of the attenuation circuit is scanned by a digitally controlled narrow band filter which is swept from the selected desired signal over a desired range. The amplitude of the signals passed by the filter is measured and displayed or recorded along with its frequency. An integral circuit compares the amplitude of the passed phase signal with the datum level to indicate the desired percentage of carrier measurement value.

OBJECTS OF THE INVENTION

It is an object of this invention to provide an electrical measurement instrument.

A further object of the invention is to provide an electrical measurement instrument for measurement of phase noise in relation to a desired signal.

A still further object of this invention is the provision of a phase noise measurement instrument operating over a wide range of input signal levels.

BRIEF DESCRIPTION OF THE DRAWINGS

These and other objects, advantages, and beneficial features of the invention will be apparent to those versed in the art from the following description taken together with the accompanying drawings wherein.

DESCRIPTION OF PREFERRED EMBODIMENTS OF THE INVENTION

Figure 1:
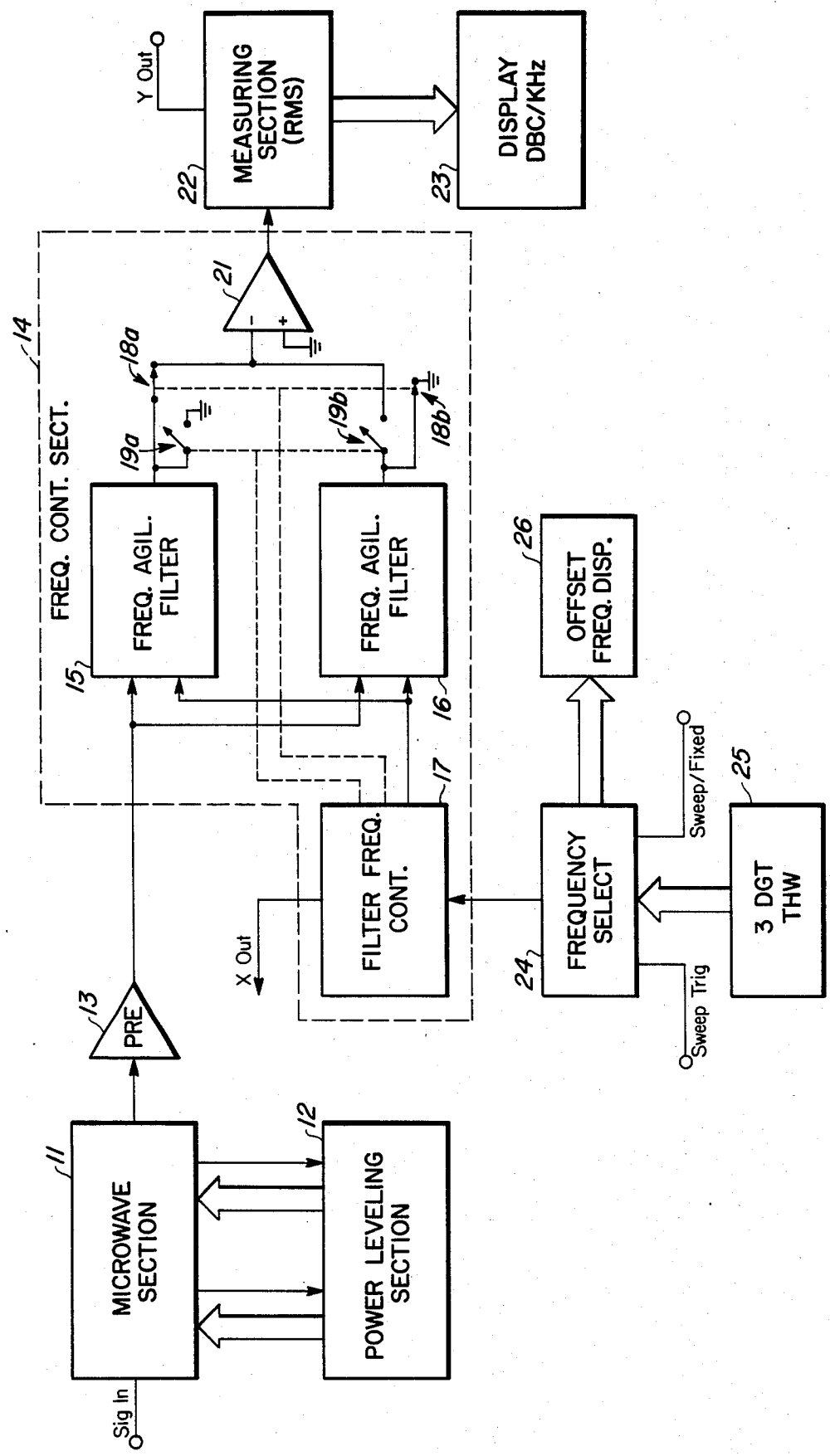
FIG. 1 is a simplified block diagram of the invention.

FIG. 1 shows an overall block diagram of the circuit of the invention illustrating the major components. A microwave section 11 receives a signal consisting of the processed or desired signal and any phase noise which the generating circuit may have added to the signal. Microwave section 11 processes the signal in a manner to be more completely described, to a datum reference value as determined by power leveling section 12. The output of microwave section 11 is fed to a preamplifier 13. Preamplifier 13 performs the customary functions of decoupling and impedance matching as well as level amplification.

A frequency control section 14 receives the output of preamplifier 13 and performs the function of selecting a frequency of the phase noise to be measured. Frequency control section 14 consists of a pair of frequency agile filters 15 and 16 which, as will be more clearly described, are essentially identical except for amplification. Frequency agile filters 15 and 16 are controlled by a central frequency control 17. This control has an output which is coupled to each of the frequency agile filters 15 and 16. The central frequency control 17 also includes outputs which control switches 18 and 19.

Switch 18 is seen to consist of two single-throw sections 18A and 18B. Similarly, switch 19 is a single-throw, two-pole switch having sections 19A and 19B. The output of the central frequency control 17 operates these switches alternatively. That is, switch 18 is closed while switch 19 is open and vice versa. Depending on the control frequency the output of frequency agile filters 15 and 16 are fed to an operational amplifier 21 which serves as an isolator for the frequency control section 14 and feeds the filtered signals to a measuring section 22. Measuring section 22 measures the RMS value of the signals passed by frequency agile filters 15 and 16. Output is fed to a digital display circuit which is calibrated to display the decibels below carrier per kilohertz frequency deviation, (dbc/kHz) Central frequency control 17 obtains a frequency selection signal from a frequency selector 24, to be more completely described, which is configured to accept a sweep trigger input and a manual setting from a three digit thumbwheel 25 and a toggle action which provides for frequency sweep or fixed frequency operation. Additionally, an offset frequency display 26 has proven beneficial to determine the frequency at which central frequency control 17 has been set.

Figure 2:
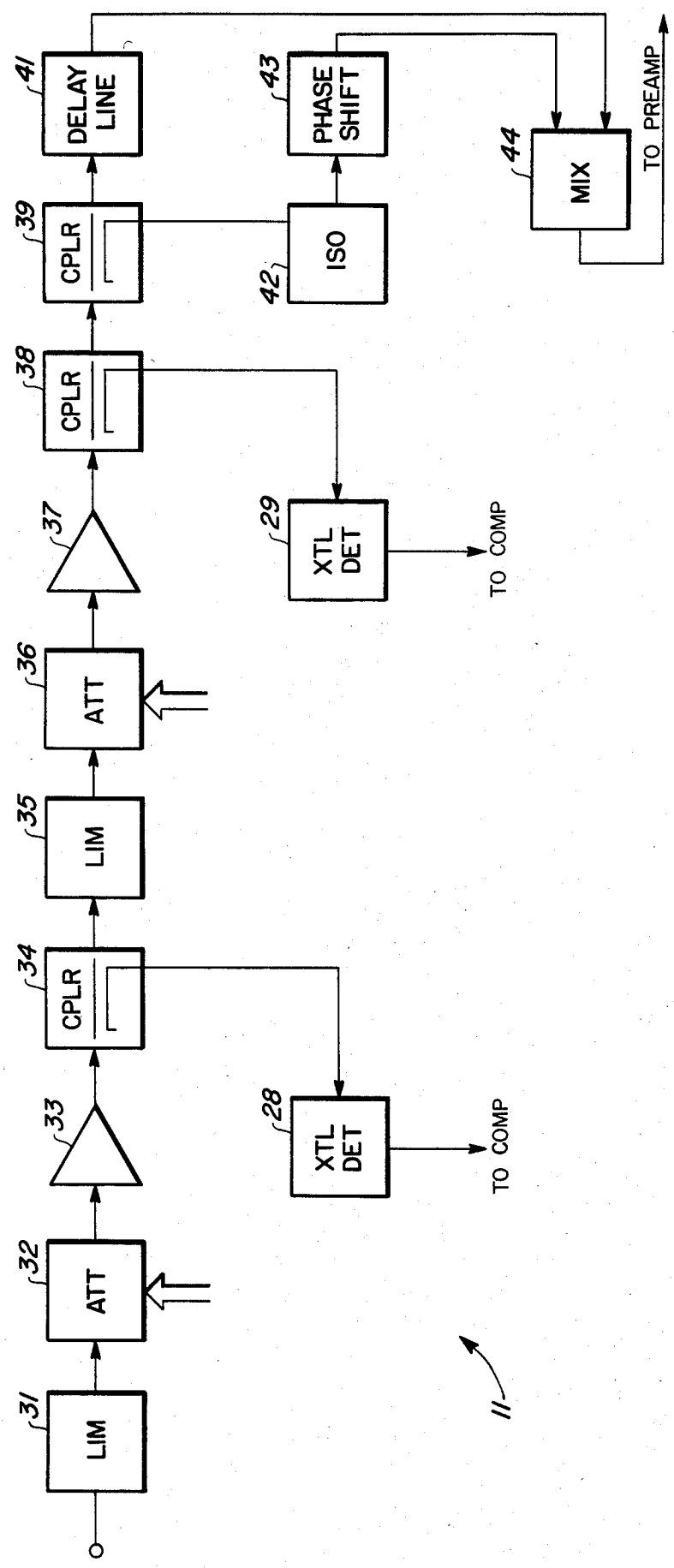
FIG. 2 is a more detailed diagram of the microwave section of FIG. 1.

FIG. 2 shows how conventional electronic components are combined to comprise microwave section 11. A limiter 31 receives the input signal and prevents excessive microwave power from causing possible damage to the circuitry which follows. In addition, limiter 31 cooperates with attenuators 32 and 36, to be more completely described, in reducing large input signal levels to a predetermined datum level. The output of limiter 31 is coupled to a digitally controlled attenuator 32. Any commercial high quality attenuator might be used observing customary engineering trade-offs, however, in developmental models, attenuators manufactured by Hewlett-Packard in the 94XX series have been used to good effect. These attenuators have 11 decade steps which may be conveniently digitally controlled. The output of attenuator 32 is coupled to a low noise amplifier 33, also of conventional design, which serves as a buffer and is configured to provide a maximum of 16 decibels gain.

The output of amplifier 33 is fed to a coupler 34 which taps a small portion of the signal to feed a detector 28 of conventional design. The purpose of detector 28 is to provide a signal to be fed to a signal comparator used in the control of attenuator 32. A limiter 35 follows coupler 34 and provides a similar functions as limiter 31 for limiting the output from attenuator 32 and amplifier 33 combination. The output of limiter 35 is fed to an attenuator 36 with an associated amplifier 37, coupler 38 and detector 29. The units function in the same manner as attenuator 32, amplifier 33, coupler 34 and detector 28, previously described. The use of two attenuators and amplifiers implement the input power leveling loop and are chosen to provide a minimum of noise generated internally in the phase noise analyzer. As will be well understood, these noise reduction steps are considered necessary in a measuring instrument such that internally generated noises do not comprise part of the measured signal.

This principle of reducing the internal noise by successive limiting and attenuation and low gain amplification has proven to be very effective in increasing the sensitivity of the instrument such that phase noise at 95 db below the carrier can be measured. In addition, the leveling loop allows the instrument to be compatible with input power levels ranging from −12.5 dbm to +30 dbm.

The output from coupler 38 is fed to a second series coupler 39 which drives a delay line 41 and couples a small portion of the signal to a phase shifter 43 via an isolator 42. These signals are mixed in a mixer 44 to produce the output signal. Those familiar with electronic measuring instruments will recognize that circuitry of coupler 39, delay line 41, phase shifter 43 and mixer 44 comprise a narrow band FM discriminator. The output of the mixer is an AC signal the frequency of which is equal to the offset frequency and whose level is given by the equation:

output level = (input sideband loss)(discriminator loss)(mixer conversion loss), or
( $V_0(mixer) = (V_i \times \beta/2)(k\omega_m\tau)(L_m)$
where;
$V_0$ = output level,
$V_i$ = input level,
$\beta$ = modulation index,
k = a constant empirically determined; approximately three in the illustrated circuit,
$L_m$ = mixer loss,
$\omega_m$ = conventional frequency ($2\omega f$) indication of modulating frequency, and
$\tau$ = conventional time.

Figure 3:
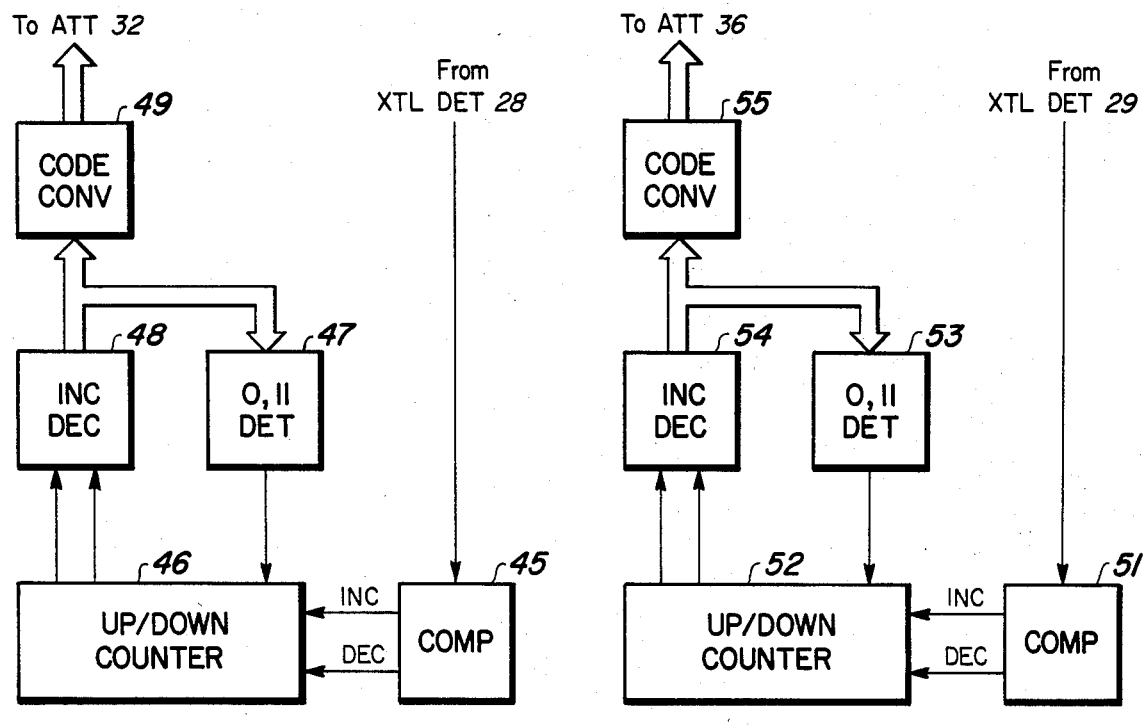
FIG. 3 is a diagramatic showing of the power leveling section shown in FIG. 1.

FIG. 3 shows the digital control sections for attenuators 32 and 36. A comparator 45 receives a signal from detector 28 and determines if the detected level is above or below a reference level. Dependent on this conventional determination, an output signal indicated as increase or decrease is fed to an up-down counter 46. Up-down counter 46 also receives a signal from a zero and eleven detector 47. The output of up-down counter 46 is fed to an incremental decade generator 48 which in turn feeds a code converter 49, also of conventional configuration, that converts the output to a 4421 digital coded signal for control of the attenuator 32. These units are all conventional digital packaged semiconductor devices and choice among different types and manufacturers may be made within the scope of the invention by following good engineering practice.

In a similar fashion, attenuator 36 is controlled by a signal comparator 51 which feeds up-down counter 52. Like up-down counter 46, up-down counter 52 receives a signal from a zero and eleven detector 53 and feeds an incremental decade device 54 and a code converter 55.

Figure 4:
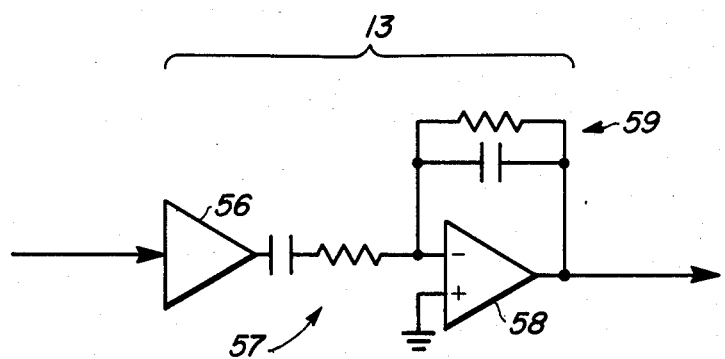
FIG. 4 is a block diagram of the preamplifier between the microwave section and the frequency control section shown in FIG. 1.

FIG. 4 shows the details of preamplifier 13. A conventional ZN459C integrated amplifier 56 feeds an operational amplifier 58 via a series RC network 57. Amplifier 58 is a conventional LF357 operational amplifier and has its gain controlled by parallel RC network indicated at 59.

Figure 5:
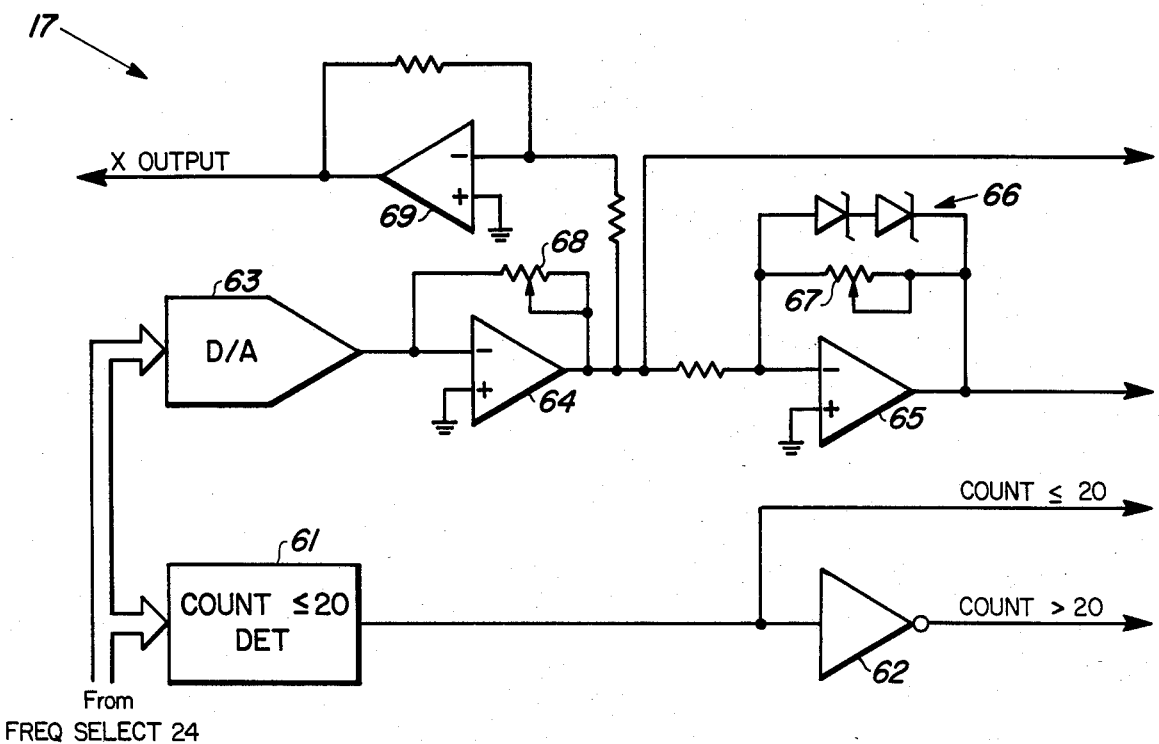
FIG. 5 is a block diagram of the filter frequency control shown in FIG. 1.

FIG. 5 shows the diagramatic relationship of conventional elements making up the filter frequency control circuit 17. Because of the frequency and gain limitations of the active components used in the circuit, two frequency agile filters are switched as the frequency being measured is swept. One filter operates over the 1 to 20 Khz range, while the other covers the 20 to 200 Khz range.

As shown, a count equal to or less than 20, detector 61 receives signals from the frequency select circuit 24 and produces an output signal which is fed directly to the switch 18 while inverter 62 is in series for the feed to switch 19. A digital to analog converter 63 provides an analog signal output which is fed to operational amplifier 64 which has a feedback resistor 68 to control the gain thereof. This analog output is fed to one of the frequency agile filters directly and to the other via amplifier 65 which is bypassed with a potentiometer 67 and diode pair indicated at 66. An X output is taken from amplifier 64 via operational amplifier 69 to provide an X axis indication of the frequency as it is swept through the desired range.

Figure 6:
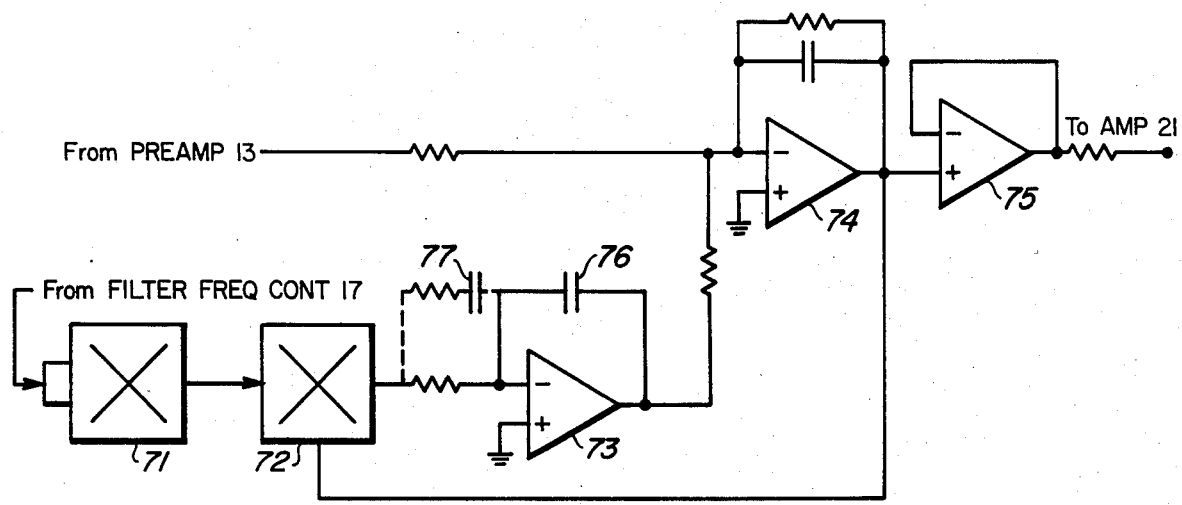
FIG. 6 is a diagramatic showing of a frequency agile filter as used in the frequency control section.

FIG. 6 illustrates the control and circuit arrangement of frequency agile filters 15 and 16. Since these circuits are essentially identical, only one figure illustrates the two filters with a broken line connection indicating the differences.

The frequency control for the filter comes from filter frequency control circuit 17, previously described and is fed to a multiplier 71 which in turn feeds a multiplier 72. The output of multiplier 72 is fed to a control amplifier 73 which is used to control an operational amplifier 74 which receives the frequency band to be measured from preamplifier 13. The output from operational amplifier 74 is fed to second operational amplifier 75 which serves as a buffer and isolator for the output of frequency agile filter. As shown, operational amplifier 73 has a capacitor feedback indicated at 76. This feedback capacitor controls the gain of amplifier 73 in a conventional, well understood fashion. A series RC network indicated at 77 provides frequency compensation for the (20-200) Khz frequency agile filter. The (1-20) Khz frequency agile filter does not require the series RC compensating network. Except for this difference of feedback loop 77, the two circuits are identical. The operation of the circuit is conventional.

Figure 7:
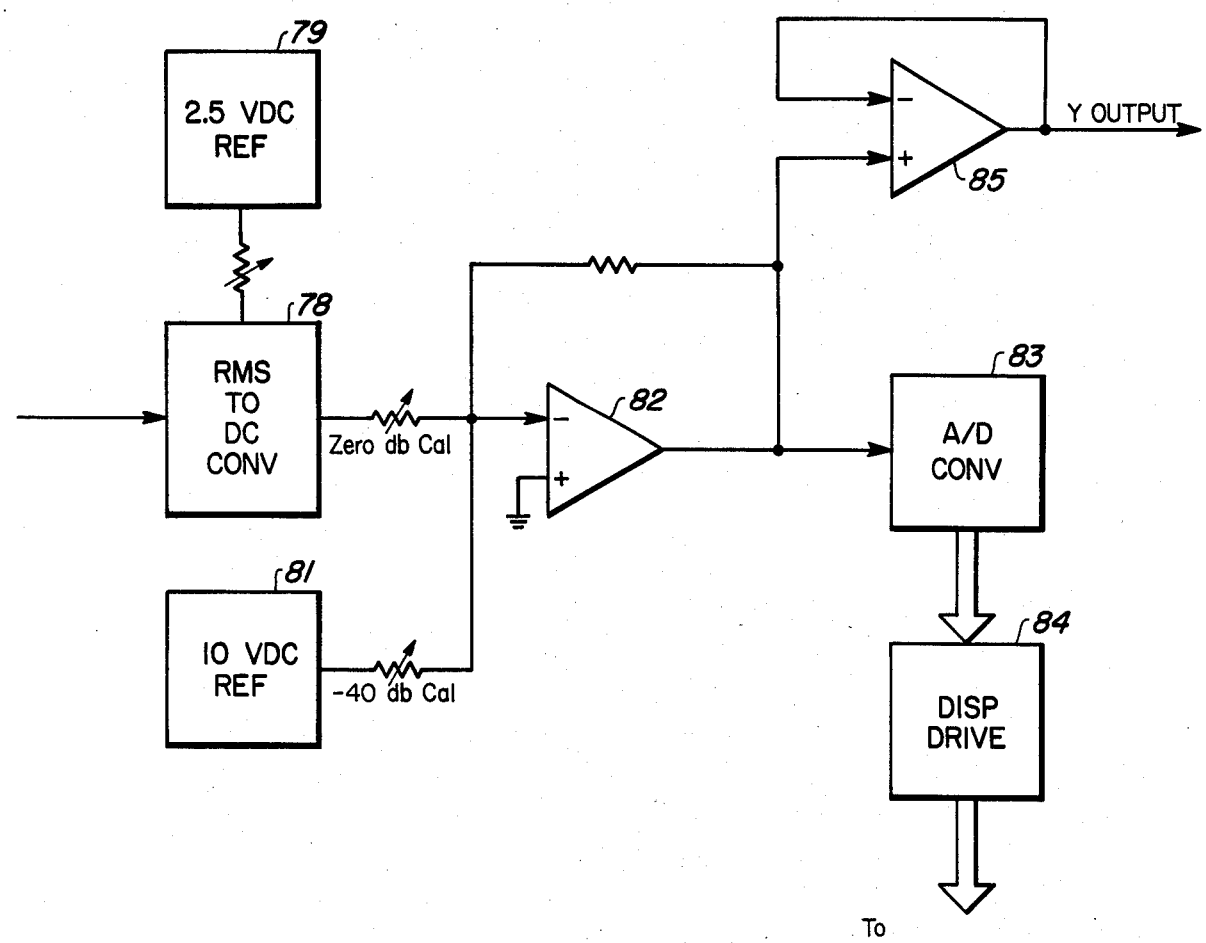
FIG. 7 is a block diagram of the measuring section shown in FIG. 1.

FIG. 7 shows certain details of the measuring section 22 illustrated in FIG. 1. The input from amplifier 21 is fed to an RMS to DC converter 78 which also receives a DC voltage from a 2.5 VDC reference 79. The DC output is resistively coupled by a potentiometer used for zero decibel calibration to an operational amplifier 82. A ten volt DC reference 81 is also connected to operational amplifier 82 via a −40 decibel calibration potentiometer. The output of operational amplifier 82 is connected to an analog to digital converter, the digital output of which is connected to a display drive 84. The details of the display are not shown as they are conventional and not essential to the understanding of the invention. A Y axis output to complement the X axis output previously discussed is obtained from the output of amplifier 82 by an operational amplifier 85 connected thereto which provides buffer isolation.

Figure 8:
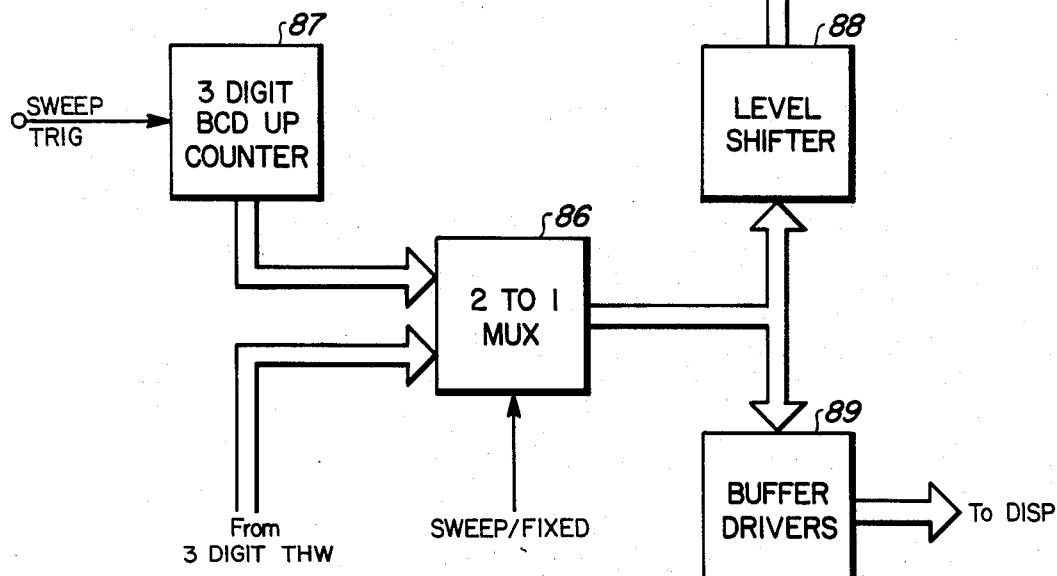
FIG. 8 is a block diagram of the frequency selection section shown in FIG. 1.

Referring to FIG. 8, a two-to-one multiplexer 86 is utilized by the frequency select circuit to control the frequency selection criteria sent to the center frequency control, previously described. Multiplexer 86 receives an input from a three digit thumbwheel type device, well understood in the electronic arts. An enabling circuit which causes multiplexer 86 to sweep a band of frequencies or to transmit a fixed frequency is also provided by conventional manual switching. A three digit BCD up-counter 87 is triggered by a sweep trigger circuit which is externally derived. The output of the three digit BCD up-counter 87 is fed to multiplexer 86 as an input thereto. The output of multiplexer 86 is fed to a level shifter circuit 88 which adjusts the level of the output signal to the voltage level requirements of the center frequency control. Multiplexer 86 also provides an input signal to a buffer driver circuit 89 which is used to feed the offset frequency display, not shown.

The operation of the invention is the combined operation of the individual circuits, that is, microwave section 11 adjusts the level of the desired signal, which may thought of as a carrier, to a desired datum level. This adjustment is performed by a pair of serially connected attenuators 32 and 36 which are controlled in a loop fashion to arrive at the datum value. That output is filtered by a pair of frequency agile filters 15 and 16 which are changed in frequency and changed as between the two filters so as to provide swept coverage of the desired frequency band. A center frequency control 17 provides the necessary control for the frequency agile filters to provide this desired sweep action. Center frequency control is set by selection of one of a plurality of conventional inputs. The output of the filtered section is fed to a calibrated display unit which, because the datum level of the carrier set by the microwave section 11, may be calibrated to read any desired level but, preferably calibrated to read decibels below carrier.

The foregoing description, when taken together with the appended claims and drawings, constitute a disclosure enabling a person familiar with these arts to make and use the invention. Further, the described invention is a meritorious advance in the electronics art which would be unobvious to such a person not having the benefit of the teachings contained herein.

What is claimed is:

1. A phase noise analyzer for analyzing phase noise of a desired frequency range in the microwave region in relation to carrier level comprising:
   a microwave section for receipt of a signal to be analyzed having an attenuation circuit, a phase detector, and an output circuit;
   a power leveling section connected to said microwave section and effective to control said attenuation circuit therein to set the level of said output circuit to a predetermined datum level;
   a narrow band frequency control section effectively connected to said output circuit and including a tunable narrow bandpass filter means with center frequency controlled by a filter center frequency controller for passing electrical energy having a frequency within a predetermined range; and
   a measuring section connected to said narrow band frequency control section for determining the amplitude value of electrical energy passed by said narrow band frequency control section in relation to said carrier level and frequency separation from said carrier level.

2. A phase noise analyzer according to claim 1 further including a frequency selection section connected to said frequency control section for determining the center frequency of said predetermined range of passed frequencies passed thereby.

3. A phase noise analyzer according to claim 1 wherein said attenuation circuit in said microwave section comprises:
   a variable attenuation means including:
      a limiter circuit for limiting the level of electrical signals having electrical energies above a designed value connected to receive signals of interest;
      an attenuation circuit connected to said limiter means and configured to attenuate the electrical signal passed by said limiter means by an amount determined by an electrical control signal applied thereto; and
   coupler means effectively connected to said attenuation means for tapping a small amount of electrical energy for control purposes; and
   wherein said phase detector in said microwave section comprises:
      a narrow band FM discriminator connected to said variable attenuation means.

4. A phase noise analyzer according to claim 3 wherein said variable attenuation means further includes a plurality of serially connected sections, each including a limiter circuit, an attenuation circuit, and a coupler means connected as recited therein.

5. A phase noise analyzer according to claim 3 wherein said narrow band FM discriminator includes:
   a delay line connected to receive the throughput signal from said coupler and having an output;
   a phase shifter effectively connected to receive the throughput signal from said coupler and having an output; and
   a mixer having two inputs connected respectively to the outputs of said delay line and said phase shifter.

6. A phase noise analyzer according to claim 4 wherein said power leveling section includes a plurality of voltage control loops which are configured to provide control signals to said attenuation means for determining the attenuation thereof.

7. A phase noise analyzer according to claim 1 wherein said tunable narrow bandpass filter means includes:

a plurality of frequency agile filters each of which covers a portion of the desired frequency range of phase noise analysis;

a frequency control circuit connected to said frequency agile filters to sweep their pass frequencies over a predetermined range; and switching means connected to the output of said frequency control circuit and to the output of said frequency agile filters for selection of the output of a selected one of said frequency filters in accordance with the output of the frequency control circuit.

* * * * *